United States Patent [19]
Seifert

[11] Patent Number: 6,081,652
[45] Date of Patent: Jun. 27, 2000

[54] CERAMIC FLASH TV EVAPORATOR

[75] Inventor: Martin Seifert, Kempten, Germany

[73] Assignee: Elektroschmelzwerk Kempten GmbH, Munich, Germany

[21] Appl. No.: 09/129,009

[22] Filed: Aug. 4, 1998

[30]     Foreign Application Priority Data

Aug. 18, 1997 [DE] Germany .......................... 197 35 814

[51] Int. Cl.[7] ............................. B01D 7/00; C23C 16/00
[52] U.S. Cl. .......................... 392/389; 118/726; 427/593
[58] Field of Search ................................... 392/386, 388, 392/389; 118/726, 727; 432/156, 262; 427/592, 593

[56]              References Cited

U.S. PATENT DOCUMENTS

| 3,020,177 | 5/1962 | Alexander | 392/389 |
|---|---|---|---|
| 4,043,748 | 8/1977 | Watanabe et al. | 432/253 |
| 5,239,612 | 8/1993 | Morris | 392/389 |
| 5,395,180 | 3/1995 | Mariner | 392/389 |
| 5,537,507 | 7/1996 | Mariner et al. | 392/389 |
| 5,671,322 | 9/1997 | Finicle | 392/389 |

FOREIGN PATENT DOCUMENTS

| 1207179 | 12/1965 | Germany . |
|---|---|---|
| 2647011 | 6/1977 | Germany . |
| 2187477 | 9/1987 | United Kingdom . |

OTHER PUBLICATIONS

Patent Abstracts of Japan, vol. 007, Aug. 12, 1982, No. 053 & JP 57200560.

*Primary Examiner*—Sang Paik
*Attorney, Agent, or Firm*—Burgess, Ryan & Wayne

[57]              ABSTRACT

The invention relates to a flash TV evaporator for the evaporation coating of cathode ray tubes with aluminium, having a cavity from which the aluminium is evaporated when a current flows through the flash TV evaporator, wherein the width of the cavity tapers from the upper edge of the evaporator to the lower edge of the evaporator.

5 Claims, 3 Drawing Sheets

CERAMIC FLASH TV EVAPORATOR

BACKGROUND OF THE INVENTION

1) Field of the Invention

The invention relates to ceramic "flash TV evaporators", hereafter also referred to as "flashers".

2) Background Art

Flashers are used for the evaporation coating of monochrome or color cathode ray tubes with aluminium, in order to produce an electrically conductive layer measuring from a few hundred nanometers in the cathode ray tubes. This layer represents the electrode for accelerating the electrons in the cathode ray tube once it has been manufactured.

The dimensions of the flashers are generally 4*6*110 mm. The flasher 1 has a cavity 2 which is rectangular in the cross section of the flasher (see FIG. 1c). The cavity generally has a size of 2*4*40 or 60 mm. In the evaporation coating system, the flasher is clamped between two steel plates 6 with the aid of two screws 5. The steel plates are connected to a current source 8 via copper cables 7. To improve contact, there is generally a graphite sheet 9 between each steel plate and the flasher 1 (see FIG. 1a). The width to which it is clamped laterally at each end is about 15 mm. The length of the flasher to be heated is normally 80 mm.

The cathode ray tubes are evaporation coated as follows:

A piece of aluminium (<100 mg), generally a cylindrical Al body, or pellet, is put in the cavity of the flasher. The cathode ray tube covering which is to be evaporation coated is positioned over the flasher. The space below the cathode ray tube covering is then evacuated, so that the flasher with the clamping system is contained in this vacuum ($10^{-5}$ mbar).

By a direct passage of current, the flasher is heated and the aluminium contained in its cavity is evaporated. The time required for this process is in the region of 40 sec to 2 min. The current densities involved briefly reach values of up to $10^3$ A/cm$^2$.

This heavy electrical and therefore thermal loading is what limits the life, i.e. number of heating cycles, of the flasher.

The flasher usually cracks in the region of the cavity after 500–900 heating cycles. It becomes broken and needs to be replaced.

The object of the invention is to provide a flash TV evaporator for the evaporation coating of cathode ray tubes with aluminium, which has an extended life, more defined behavior in terms of the evaporation of aluminium, improved wetting behavior and being nevertheless usable in conventional evaporator systems.

SUMMARY OF THE INVENTION

The present invention relates to flash TV evaporators for the evaporation coating of cathode ray tubes with aluminium, having a cavity from which the aluminium is evaporated when a current flows through the flash TV evaporator, wherein the width of the cavity tapers from the upper edge of the evaporator to the lower edge of the evaporator.

DESCRIPTION OF THE PREFERRED EMBODIMENTS

Figure 1A:
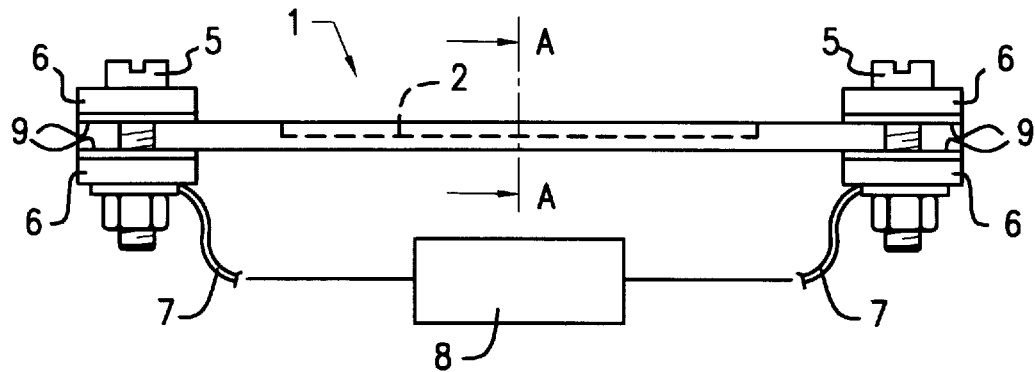
FIG. 1 shows a top view (A), lateral view (B) and cross-sectional view (C) of a standard flash TV evaporator in a clamping system.
Figure 1B:
Figure 1C:
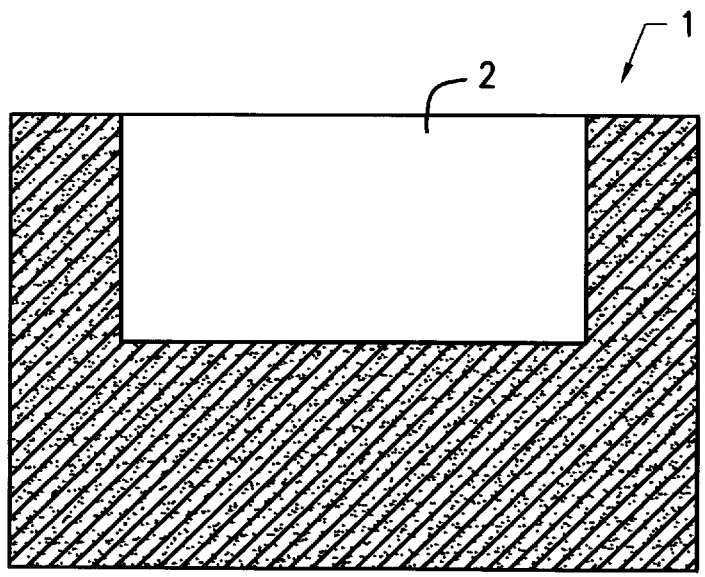
Figure 3:
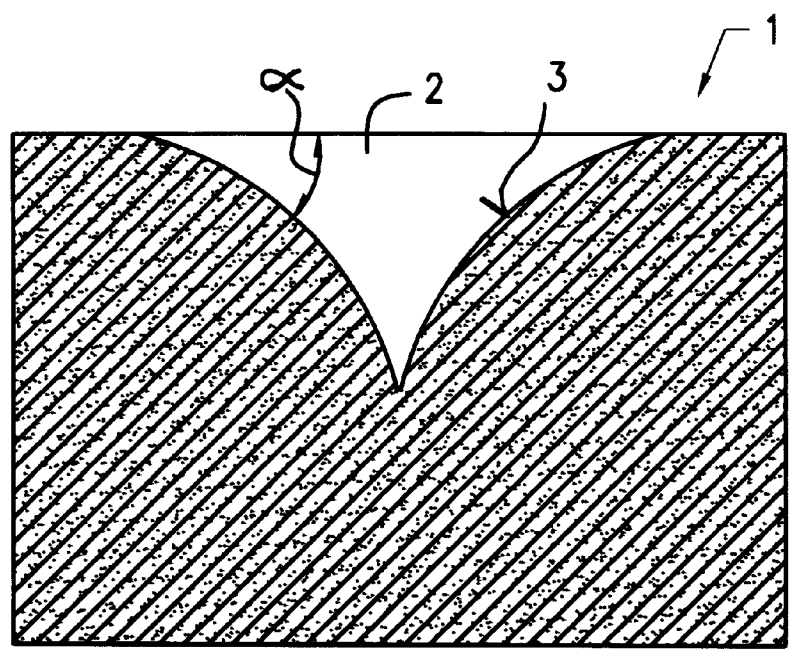
FIG. 3 shows a flasher 1 according to the invention, the cavity 2 of which has a triangular shape with convexly curved walls 3 in cross section through the flash TV evaporator.
Figure 4:
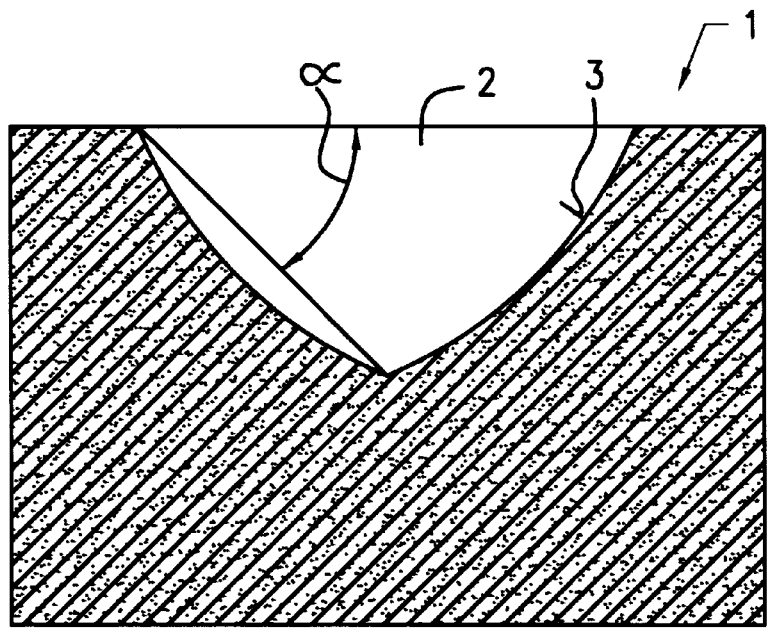
FIG. 4 shows a flasher 1 according to the invention, the cavity 2 of which has a triangular shape with concavely curved walls 3 in cross section through the flash TV evaporator.
Figure 5:
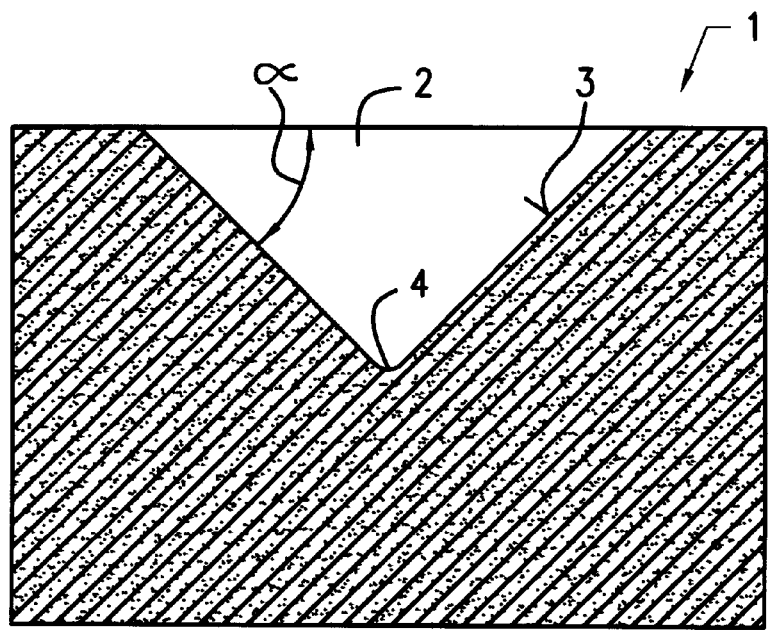
FIG. 5 shows a flasher 1 according to the invention, the lowest point of whose cavity 2 is designed in the form of a radius 4.

The flashers according to the invention have, for example, a cavity which exhibits a triangular shape in cross section through the flasher, as reproduced in FIG. 1 for a conventional flasher with cross section A—A. The two side faces of the triangle, which face the evaporator, may be straight (FIG. 2) or convexly (FIG. 3) or concavely (FIG. 4) curved. The lowest point of the cavity may be designed as a radius (FIG. 5).

In the extreme case this leads, when the side faces are convexly curved, to the cavity having a semicircular shape.

In the extreme case this leads, when the side faces are concavely curved, to a narrow linear indentation in the longitudinal direction of the flasher as the cavity.

The angle alpha according to FIGS. 2–5 is preferably between 25° and 60°.

The cavity is preferably 2 mm to 6 mm wide on the upper face of the evaporator.

The lowest location of the cavity is preferably at least 1 mm and at most 3 mm above the lower edge of the evaporator.

The length of the cavity is preferably between 30 mm and 80 mm.

The effect of the enlargement according to the invention of the cross section of the flasher in the region of the cavity is to reduce the maximum current densities and permit a larger number of heating cycles.

At the same time, by virtue of the cavity shape according to the invention, the cylindrical Al pellets are positioned accurately in the longitudinal axis of the cavity of these flashers, which leads to more uniform spreading of the Al vapor cloud irrespective of the number of heating cycles.

Further, the lower edge of this cross section acts as a capillary, which leads to improved wetting of the flasher by the Al.

The flashers according to the invention can be made from the ceramic powders containing $TiB_2$, BN and optionally AlN which are customary for evaporators of this type.

They can be operated in customary evaporator systems without it being necessary to make modifications to these systems.

The following example will serve to explain the invention further:

EXAMPLE

Figure 2:
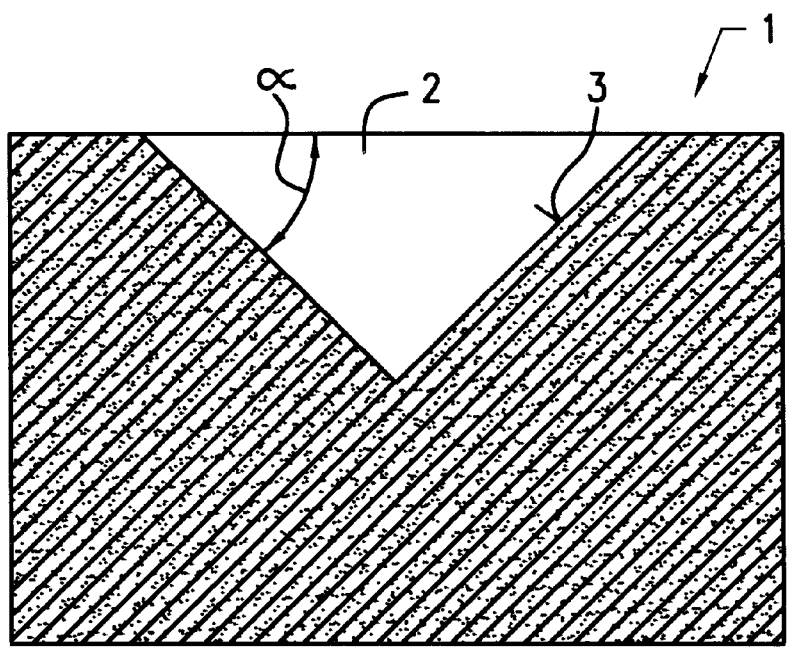
FIG. 2 shows a flasher 1 according to the invention, the cavity 2 of which has a triangular shape with straight walls 3 in cross section through the flash TV evaporator.

A sintered body was used to make a flasher 1 whose cavity 2 has the known cross section (FIG. 1c) and a flasher whose cavity has the cross section according to the invention (FIG. 2). For comparison, the two flashers were fastened in a clamping system in which two flashers can be operated in parallel. The quantity of aluminium to be evaporated was 83 mg in each case. The flasher with known cavity withstood 820 heating cycles; the flasher with a cavity according to FIG. 2 withstood 1080 heating cycles.

Repeated measurements with further pairs of flashers gave similar results.

What is claimed is:

1. A ceramic flash TV evaporator for the evaporation in coating of cathode ray tubes with aluminum formed from ceramic powder comprised of $TiB_2$, BN and optionally, AlN, having an upper edge and a lower edge and a cavity from which the aluminum is evaporated when a current flows through the flash TV evaporator wherein the width of the cavity tapers from the upper edge of the evaporator to the lower edge of the evaporator to form a cavity shape which in cross-section is selected from the group consisting of a triangular shape with straight sides, a triangular shape with convexly curved sides and a triangular shape with concavity curved sides.

2. The flash TV evaporator as claimed in claim 1, wherein the cavity has its lowest point in the form of a radius.

3. The flash TV evaporator as claimed in claim 1, wherein the cavity is 2 mm–6 mm wide on the upper edge of the evaporator.

4. The flash TV evaporator as claimed in claim 1, wherein the length of the cavity is between 30 mm and 80 mm.

5. The flash TV evaporator as claimed in claim 1, wherein the angle formed by the upper edge of the evaporator and the cavity is between 25° and 60°.

* * * * *